United States Patent [19]

Holistein, Jr. et al.

[11] 3,719,896

[45] March 6, 1973

[54] PHASE LOCK OSCILLATOR WITH PHASE COMPENSATION CIRCUIT FOR USE IN DATA PROCESSING SYSTEM

[75] Inventors: Carl P. Holistein, Jr.; Gerald H. Kiltz; Frank J. Sordello, all of San Jose, Calif.

[73] Assignee: International Business Machines Corporation, Armonk, N.Y.

[22] Filed: Nov. 13, 1970

[21] Appl. No.: 89,533

Related U.S. Application Data

[62] Division of Ser. No. 754,883, Aug. 23, 1968, Pat. No. 3,573,640.

[52] U.S. Cl. ........................331/14, 331/17, 331/25, 340/174.1 A

[51] Int. Cl. ..............................................H03b 3/04

[58] Field of Search.......331/14, 17, 25; 340/174.1 A

[56] References Cited

UNITED STATES PATENTS

| | | | |
|---|---|---|---|
| 2,838,674 | 6/1958 | Trousdale | 331/17 |
| 2,922,118 | 1/1960 | Albright | 331/17 |

*Primary Examiner*—Roy Lake
*Assistant Examiner*—Siegfried H. Grimm
*Attorney*—Nathan N. Kallman

[57] ABSTRACT

A phase compensation circuit incorporates series capacitors shunted by resistance means, with the signal channeled through the circuit so that there is virtually no loss of D.C. gain.

4 Claims, 3 Drawing Figures

PHASE LOCK OSCILLATOR WITH PHASE COMPENSATION CIRCUIT FOR USE IN DATA PROCESSING SYSTEM

CROSS REFERENCE TO RELATED APPLICATION

This application is a division of copending application Ser. No. 754,883, entitled "Phase Compensation Circuit" filed Aug. 23, 1968 now U.S. Pat. No. 3,573,640, on which priority is claimed.

In U.S. Pat. application Ser. No. 735,137 filed June 6, 1968, entitled "Phase Locked Oscillator For Storage Apparatus", now U.S. Pat. No. 3,577,132, the disclosed oscillator circuit employs a compensation and integration network for controlling signal phase and bandwidth to ensure stability of the oscillator. The present application teaches an improved phase compensation and integration circuit.

BACKGROUND OF THE INVENTION

1. Field of the Invention

This invention relates to a novel phase compensation circuit, and in particular to a simplified, improved phase correction circuit useful in a phase lock oscillator of a data processing system.

2. Description of the Prior Art

There are many systems that require signal phase compensation in order to eliminate or at least minimize spurious oscillation and to ensure stability of operation. By way of example, phase compensation circuits are used in servosystems for motor control, and in phase lock oscillator circuits of data processing systems to achieve correct phase. However, with presently known phase lead compensation circuits, the signal that is being processed experiences a loss of D.C. gain, thereby necessitating a costly and complex D.C. amplifier at the output of the circuit.

In some systems, such as random access disk files, wherein a head assembly is transported between data tracks at relatively high speed to seek out a selected track and then follows the selected track for recording or readout, it is desirable to provide a high gain, fast lock-on during the read/write period. Switching between the seek and read/write modes should not affect the D.C. gain of the phase locked oscillator used for synchronization and phase error correction.

SUMMARY OF THE INVENTION

An object of this invention is to provide a novel and improved phase locked oscillator and compensation circuit.

Another object of this invention is to provide a phase locked oscillator and compensation circuit that has no D.C. loss, thereby precluding the need of a D.C. amplifier.

Another object is to provide a phase locked oscillator and compensation circuit that affords transfer of operation from one level of gain to another, without distortion or loss of D.C. gain.

According to this invention, a phase locked oscillator and compensation circuit comprises at least a pair of capacitors in series, shunted by a resistance that is coupled at one end between the capacitors, and at the other end to a junction between one of the capacitors and the output circuit. An input current, representing phase error is applied to the line including the junction, and the circuit acts to supply an averaging effect to correct for the phase error.

In one particular mode of operation, a phase discriminator of a phase locked oscillator provides an error signal developed by comparing the time relationship of the output signal of a voltage controlled oscillator to that of a reference signal. A pulse of current is developed in response to the error signal, having a duration related to the magnitude of the phase error. The duration of the current pulse determines the charging period of the capacitive network of the circuit disclosed herein, and subsequently establishes the level or amplitude of control voltage fed to the voltage controlled oscillator. The particular arrangement of capacitance and resistance ensures that there is no D.C. loss in the phase compensation circuit.

BRIEF DESCRIPTION OF THE DRAWINGS

The foregoing and other objects, features and advantages of the invention will be apparent from the following more particular description of preferred embodiments of the invention, as illustrated in the accompanying drawings, in which.

DESCRIPTION OF THE PREFERRED EMBODIMENT

Figure 1:
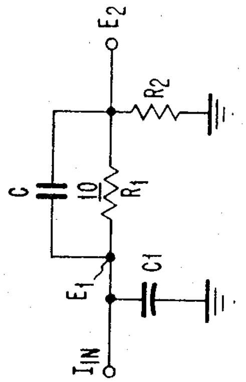
PRIOR ART FIG.1
FIG. 1 is a schematic diagram of a prior art phase compensation circuit, presented by way of example.

In FIG. 1, a prior art phase-lead compensation circuit is illustrated, including an integrating capacitor C1 which receives a pulsed current input $I_{in}$, representative of a phase error signal. The capacitor C1 is charged to a value proportional to the duration of the current pulse signal. A compensation network 10 including a resistance $R_1$ shunted by capacitor C and grounded resistance $R_2$ is connected between the integrating capacitor $C_1$ and the output circuit, represented by $E_2$.

The relationship of the output voltage $E_2$ to the voltage $E_1$ seen at one plate of the integrating capacitor $C_1$ is $$\frac{E_2(s)}{E_1(s)} = \frac{R_2}{R_1+R_2}\left[\frac{sR_1C+1}{s\frac{R_1R_2C}{R_1+R_2}+1}\right] \tag{1}$$

where $s$ is the complex variable of the LaPlace Transform.

$$E_1 = \frac{I\Delta t}{C_1}, \quad \text{or} \quad E_1(s) = \frac{I(s)}{sC_1} \tag{2}$$

where I is the input current, and $\Delta t$ is the duration of the current pulse.

$$E_2(s) = \frac{R_2}{R_1+R_2}\left[\frac{I(s)(sR_1C+1)}{sC_1\left(\frac{sR_1R_2C}{R_1+R_2}+1\right)}\right] \tag{3}$$

It is known that the term $(R_2)/(R_1+R_2)$, which is less than unity causes a loss in D.C. gain. To avoid such unnecessary loss, the phase-lead compensation circuit of this invention is so constructed that this resistive term is eliminated.

Figure 2:
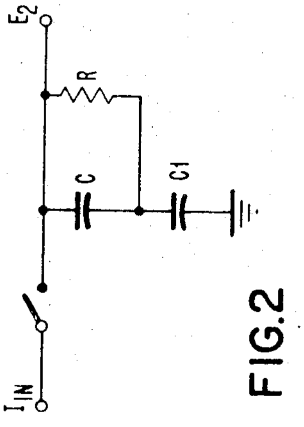
FIG. 2 is a schematic diagram of the basic circuit of this invention.

The inventive circuit is illustrated in FIG. 2 wherein the impedance $$Z(s) = \frac{sR(C_1 + C) + 1}{sC_1(sCR + 1)} \quad (4)$$

$$E_2(s) = \frac{I(s)[sR(C_1 + C) + 1]}{sC_1(sCR + 1)} \quad (5)$$

The term $(R_2)/(R_1 + R_2)$, which produces the loss of D.C. gain in the prior art circuit, it not present in this circuit arrangement. After a steady state condition is reached, there is no voltage drop seen across R, and only the voltage across $C_1$ is seen at the output $E_2$, as an open circuit voltage with no load.

Figure 3:
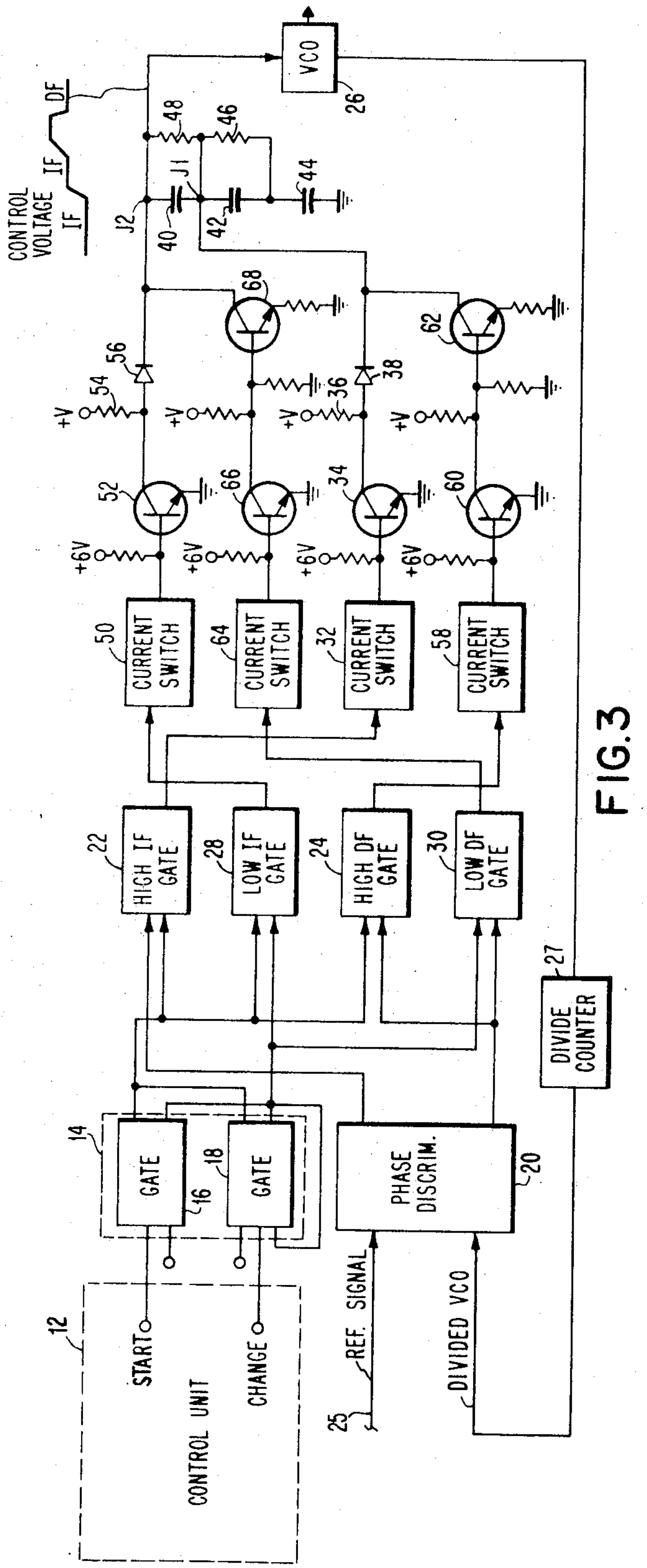
FIG. 3 is a schematic and block diagram of a portion of a phase lock oscillator, such as used in a data processing system, incorporating a modified form of the novel circuit of FIG. 2.

The novel circuit of FIG. 2 finds utility in a phase lock oscillator, partially shown in FIG. 3, which cooperates with a disk file apparatus. In operation, the oscillator receives a signal from a file control unit 12, whenever the magnetic head assembly has been transported from one track of a magnetic disk to another. The "Change Track" or "Change Cylinder" signal resets a latch 14, constituted by a pair of gates 16 and 18. In such condition, the system is in a high gain or fast lock-on mode, and the error signal from a phase discriminator 20 will pass through gate 22 or 24, designated the high increase frequency (IF) and high decrease frequency (DF) gates respectively. Approximately 25 microseconds after the "Change Track" signal is received from the control unit 12, a "Start Gate" signal is provided by the control unit to set the latch 14. The system then begins a low gain or tracking mode during which a low increase frequency (IF) or low decrease frequency (DF) signal will pass through gate 28 or 30 respectively. Another "Change Track" signal resets the latch 14, and the system goes into the high gain mode again.

The output of the phase discriminator 20 determines whether the IF or DF channels are energized, in accordance with the polarity or direction of the error signal produced by the discriminator. The inputs to the discriminator 20 are a source of reference timing signal 25, which may be obtained from a toothed gear attached to the disk drive shafts, by way of example, and the output signal from a voltage controlled oscillator (VCO) 26 divided down in a counter 27 to the frequency of the reference signal. If the frequency of the divided down signal from the VCO 26 is greater than that of the reference signal, then the error signal from the phase discriminator 20 acts to decrease the VCO output frequency; and conversely, if the VCO output signal frequency is less than that of the reference timing signal, the closed loop phase locked oscillator will increase the frequency of the VCO.

During the high gain mode, in the event that an increase frequency signal is passed through gate 22, then a current switch 32 in the high gain IF channel is activated. As a result, normally conducting NPN transistor 34 is biased off, allowing current to flow through resistor 36 and diode 38 to a junction J1 between series capacitors 40 and 42. A capacitor 44 in series with capacitors 40 and 42, forming an integrating circuit, is charged to a value dependent upon the duration of the pulse passed through the current switch 32 in response to the error signal developed by the phase discriminator 20. The voltage across the capacitor 44, which in effect is the control voltage, is applied across series resistors 46 and 48 to the VCO 26.

Similarly, during the tracking or low gain mode, if the polarity of the error signal from the discriminator 20 requires an increase in frequency of the VCO 26, and the level of control voltage thus is to be raised, then the low IF channel including gate 28 is activated, so that current switch 50 is energized, and transistor 52 is turned off. Current flows from a source of positive voltage through resistor 54 and diode 56 to the compensating and integrating network through the junction J2 to charge the capacitor 44, thereby establishing the proper level of control voltage for application to the VCO 26.

The decrease of frequency and lowering of control voltage are accomplished in either of the separate channels which include gates 24 and 30. In the high gain condition, prior to lock-in, the high DF gate 24 operates the current switch 58, which turns off normally conducting NPN transistor 60. When transistor 60 cuts off, current flows to transistor 62, which is biased on and draws current from junction J1 of the integrating and compensating network. In the low gain condition, a decrease frequency action occurs when low DF gate 30 is opened to energize current switch 64 that controls transistors 66 and 68, which serve to draw current from junction J2 of the integrating and compensating network. The signal that is processed by the integrating and compensating network is applied to the VCO 26 without loss of D.C. gain, in contrast to known prior art circuits of this type which experience such loss and require D.C. amplifiers for compensation. The VCO output is applied to the read/write circuitry of the disk file, for timing and phase control.

It should be noted that since the value of current needed for the high gain and low gain modes differ, the resistances in the respective channels are of different values. Also, the ratio of the capacitors 40 and 42 to the integrating capacitor 44 determines the level of compensation relative to the control voltage. In addition, the modified compensation and integration network utilized in FIG. 3 achieves a bumpless transfer, i.e., a change in D.C. level does not occur when going from the high gain to the low gain condition.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A phase lock oscillator for use in a random access magnetic disk file wherein the oscillator operates in a high gain, fast lock-on mode during transport of a head assembly from one data track to another, and in a low gain, tracking mode when the head assembly is stationed over a data track comprising:

a voltage-controlled oscillator means for providing an output signal having a nominal frequency;

a signal source for providing a reference signal at the frequency of the nominal frequency;

means coupled to said voltage controlled oscillator means and said signal source for comparing the output signal of the voltage controlled oscillator means and the reference signal to produce a phase error signal;

gating means coupled to a control unit and to said comparing means, responsive to a control signal for determining the mode of operation of said phase lock oscillator;

means coupled to said signal comparing means for compensating for said phase error signal, said compensating means including first and second capacitors connected in series, said first capacitor having one plate connected to a source of reference potential and the other plate coupled to one plate of the second capacitor through a junction;

a signal conducting path connected to the second plate of said second capacitor and to the input of said voltage controlled oscillator means; and resistance means connected at one end to said junction and at the other end to said signal path, whereby switching between modes is effectuated without loss of D.C. gain.

2. A circuit as in claim 1, including current switch means coupled to said gating means for charging said first capacitor to a value dependent on the value of the phase error signal.

3. A circuit as in claim 2, wherein the phase error signal compensating means develops a control voltage for correction of phase error.

4. A circuit as in claim 2, wherein said phase locked oscillator includes further means for responding to high level current pulses and low level current pulses from said current switch means for affecting different modes of operation.

* * * * *